US 6,544,880 B1

(12) United States Patent
Akram

(10) Patent No.: US 6,544,880 B1
(45) Date of Patent: Apr. 8, 2003

(54) METHOD OF IMPROVING COPPER INTERCONNECTS OF SEMICONDUCTOR DEVICES FOR BONDING

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/332,665

(22) Filed: Jun. 14, 1999

(51) Int. Cl.[7] .............................................. H01L 21/44
(52) U.S. Cl. ....................... 438/617; 438/687; 438/612
(58) Field of Search ............................... 438/612–617, 438/686–687

(56) References Cited

U.S. PATENT DOCUMENTS

| 3,648,131 A | 3/1972 | Stuby |
| 3,761,782 A | 9/1973 | Youmans |
| 4,074,342 A | 2/1978 | Honn et al. |
| 4,182,781 A | 1/1980 | Hooper et al. |
| 4,360,142 A | 11/1982 | Carpenter et al. |
| 4,670,770 A | 6/1987 | Tai |
| 4,709,468 A | 12/1987 | Wilson |
| 4,749,631 A | 6/1988 | Haluska et al. |
| 4,750,666 A | 6/1988 | Neugebauer et al. |
| 4,754,316 A | 6/1988 | Reid |
| 4,756,977 A | 7/1988 | Butt et al. |
| 4,821,151 A | 4/1989 | Pryor et al. |
| 4,829,014 A | 5/1989 | Yerman |
| 4,866,571 A | 9/1989 | Butt |
| 4,890,157 A | 12/1989 | Wilson |
| 4,906,341 A | 3/1990 | Yamakawa et al. |
| 4,967,260 A | 10/1990 | Butt |
| 4,970,571 A | 11/1990 | Yamakawa et al. |
| 5,014,159 A | 5/1991 | Butt |
| 5,058,798 A | 10/1991 | Yamazaki et al. |
| 5,059,553 A | 10/1991 | Berndlmaier et al. |
| 5,095,402 A | 3/1992 | Hernandez et al. |
| 5,106,461 A | 4/1992 | Volfson et al. |
| 5,128,737 A | 7/1992 | van der Have |
| 5,137,845 A * | 8/1992 | Lochon et al. ..... 148/DIG. 143 |
| 5,198,684 A | 3/1993 | Sudo |
| 5,217,922 A | 6/1993 | Akasaki et al. |
| 5,219,117 A | 6/1993 | Lin |
| 5,224,265 A | 7/1993 | Dux et al. |
| 5,235,212 A | 8/1993 | Shimizu et al. |
| 5,246,880 A | 9/1993 | Reele et al. |
| 5,268,072 A | 12/1993 | Agarwala et al. |
| 5,293,006 A | 3/1994 | Yung |
| 5,298,793 A | 3/1994 | Kotani et al. |
| 5,323,051 A | 6/1994 | Adams et al. |
| 5,327,013 A | 7/1994 | Moore et al. |
| 5,331,235 A | 7/1994 | Chun |
| 5,336,928 A | 8/1994 | Neugebauer et al. |
| 5,343,064 A | 8/1994 | Spangler et al. |
| 5,371,654 A | 12/1994 | Beaman et al. |
| 5,376,584 A | 12/1994 | Agarwala |
| 5,381,946 A | 1/1995 | Koopman et al. |
| 5,404,265 A | 4/1995 | Moresco et al. |

(List continued on next page.)

OTHER PUBLICATIONS

Stanley Wolf, Ph. D. and Richard N. Tauber, Ph. D., *Silicon Processing for the VLSI Era*, vol. 1: Process Technology, pp. 529–534.

Primary Examiner—Tuan H. Nguyen
Assistant Examiner—Thanh Nguyen
(74) Attorney, Agent, or Firm—TraskBritt

(57) ABSTRACT

An improved wire bond with the pond pads of semiconductor devices and the lead fingers of lead frames or an improved conductor lead of a TAB tape bond with the bond pad of a semiconductor device. More specifically, an improved wire bond wherein the bond pad on a surface of the semiconductor device comprises a layer of copper and at least one layer of metal and/or at least a barrier layer of material between the copper layer and one layer of metal on the copper layer to form a bond pad.

46 Claims, 17 Drawing Sheets

U.S. PATENT DOCUMENTS

| | | | |
|---|---|---|---|
| 5,424,245 A | 6/1995 | Gurtler et al. | |
| 5,436,411 A | 7/1995 | Pasch | |
| 5,449,314 A | 9/1995 | Meikle et al. | |
| 5,455,459 A | 10/1995 | Fillion et al. | |
| 5,468,681 A | 11/1995 | Pasch | |
| 5,470,787 A | 11/1995 | Greer | |
| 5,478,007 A | 12/1995 | Marrs | |
| 5,480,835 A | 1/1996 | Carney et al. | |
| 5,481,135 A | 1/1996 | Chandra et al. | |
| 5,485,038 A | 1/1996 | Licari et al. | |
| 5,486,721 A | 1/1996 | Herklotz et al. | |
| 5,489,804 A | 2/1996 | Pasch | |
| 5,491,612 A | 2/1996 | Nicewarner, Jr. | |
| 5,492,863 A | 2/1996 | Higgins, III | |
| 5,493,437 A | 2/1996 | Lebby et al. | |
| 5,495,667 A * | 3/1996 | Farnworth et al. | 29/843 |
| 5,497,033 A | 3/1996 | Fillion et al. | |
| 5,502,002 A | 3/1996 | Wong et al. | |
| 5,503,286 A | 4/1996 | Nye, III et al. | |
| 5,505,366 A | 4/1996 | Nishi et al. | |
| 5,521,432 A | 5/1996 | Tsuji et al. | |
| 5,547,906 A | 8/1996 | Bedehi | |
| 5,550,083 A | 8/1996 | Koide et al. | |
| 5,561,320 A | 10/1996 | Abbott et al. | |
| 5,581,498 A | 12/1996 | Ludwig et al. | |
| 5,604,379 A | 2/1997 | Mori | |
| 5,635,766 A | 6/1997 | Cain | |
| 5,665,639 A * | 9/1997 | Seppala et al. | 438/15 |
| 5,670,826 A | 9/1997 | Bessho et al. | |
| 5,672,548 A | 9/1997 | Culnane et al. | |
| 5,677,576 A | 10/1997 | Akagawa | |
| 5,682,065 A | 10/1997 | Farnworth et al. | |
| 5,719,448 A | 2/1998 | Ichikawa | |
| 5,736,456 A | 4/1998 | Akram | |
| 5,904,859 A * | 5/1999 | Degani | 216/100 |
| 6,083,820 A * | 7/2000 | Farnworth | 438/614 |
| 6,130,141 A * | 10/2000 | Degani et al. | 438/455 |
| 6,159,769 A * | 12/2000 | Farnworth et al. | 438/108 |
| 6,180,505 B1 * | 1/2001 | Uzoh | 257/737 |
| 6,187,680 B1 * | 2/2001 | Costrini et al. | 438/688 |
| 6,376,353 B1 * | 4/2002 | Zhou et al. | 438/612 |

* cited by examiner

METHOD OF IMPROVING COPPER INTERCONNECTS OF SEMICONDUCTOR DEVICES FOR BONDING

BACKGROUND OF THE INVENTION

1. Field of the Invention

The present invention relates to improved bonding of conductors with the bond pads of semiconductor devices, such as the bonding of wires to the bond pads of semiconductor devices and lead frames associated therewith or the bonding of the conductor leads in TAB tape bonding to the bond pads of semiconductor devices. More specifically, the present invention relates to improved bonds with copper bond pads of semiconductor devices, such as wire bonding or improved conductor lead bonding of TAB tape to the copper bond pads of semiconductor devices.

2. State of the Art

In semiconductor device manufacture, a single semiconductor die (or chip) is typically mounted within a sealed package. In general, the package protects the semiconductor die from damage and from contaminants in the surrounding environment. In addition, the package provides a substantial lead system for connection the electrical devices formed on the die to a printed circuit board or any other desired suitable external circuitry.

Each semiconductor die comprises a substrate having a lower surface (commonly referred to as the back of the die) that is devoid of circuitry, and an upper surface (commonly referred to as the active surface or face of the die) having integrated circuitry constructed thereon. The integrated circuitry is electrically accessible via bond pads located on the active surface of the semiconductor die which may be arranged in a wide variety of patterns, such as around the periphery of the semiconductor die, the center of the semiconductor die, both, etc.

One of the problems associated with the decreasing size of the semiconductor die and the increasing amount of circuitry included in the semiconductor die is the need to, at least, maintain the speed at which the semiconductor die operates and, if possible, to increase the operating speed of the semiconductor die. Since aluminum is typically used as the material for the connecting circuits of the semiconductor die, with smaller circuit line widths of aluminum it is difficult to maintain or increase the speed of the semiconductor die. Further, it is necessary to connect an ever increasing number of bond pads on the active surface of the semiconductor die with an ever increasing number of lead fingers of the lead frame or other type conductors, such as the conductor leads of TAB tape. In each instance, the use of a more conductive material for the connecting circuits of the semiconductor die connecting to the bond pads on the active surface of the semiconductor die is required.

In an effort to increase the operating speeds of semiconductor die using small width circuit lines, improved techniques and processes have been developed to substitute the metal copper for aluminum in the circuit lines of the semiconductor die. However, the use of copper for circuit lines and bond pads of semiconductor die causes problems when wire bonds are used to connect the copper bond pads of the semiconductor die to the leads of a lead frame or the lead conductors of TAB tape. It is difficult to form wire bond connections using standard or conventional wire bonding equipment when forming wire bonds to connect the copper bond pads of a semiconductor die to the leads of a lead frame.

Typically, the initial component in the packaging process is a leadframe. The leadframe is a metal frame which supports the semiconductor die for packaging and provides the leads for the final semiconductor package. A typical leadframe strip is produced from metal sheet stock (usually a copper, copper alloy, alloy 42, etc.) and is adapted to mount the semiconductor die.

A conventional leadframe has the semiconductor die adhesively mounted on a die paddle of the leadframe while the lead fingers (leads) extend around the periphery of the semiconductor die (the edges) terminating adjacent thereto. Subsequently, wire bonds are made to connect the bond pads on the active surface of the semiconductor die to the appropriate lead finger of the leadframe. After the wire bonding operation, the lead frame and semiconductor die are encapsulated in a transfer die molding process.

After encapsulation, the lead frame is trimmed with the remainder of the individual lead fingers being formed into the desired packaging configuration.

One of the problems associated with conventional leadframe configurations is that with the decreasing size of the semiconductor die and the increasing amount of circuitry included in the semiconductor die it is necessary to connect an ever increasing number of bond pads on the active surface of the semiconductor die with an ever increasing number of lead fingers of the lead frame. This requires that the bond pads on the semiconductor die be located on smaller pitch spacings and the width of the lead fingers be smaller. This, in turn, leads to smaller wire bonds on both the bond pads of the semiconductor die and the lead fingers of the leadframe which causes the wire bonds to be more highly stressed by the forces placed on them. This stress placed on the wire bonds requires that the metal of the bond pad, to which the wire bond is to be made, be highly susceptible to wire bonding and the formation of high strength wire bonds therewith when using well known wire material, such as gold, etc. and standard or conventional wire bonding equipment.

In a Leads-Over-Chip (LOC) type lead frame configuration for an integrated circuit semiconductor device the lead fingers of the lead frame extend over the active surface of the semiconductor die being insulated therefrom by tape which is adhesively bonded to the active surface of the semiconductor die and the bottom of the lead fingers. In this manner, the semiconductor die is supported directly from the lead fingers of the leadframe. Electrical connections are made between the lead finger of the lead frame and the bond pads on the active surface of the semiconductor die by way of wire bonds extending therebetween. After wire bonding, the leadframe and semiconductor die are encapsulated in suitable plastic material. Subsequently, the lead fingers are trimmed and formed to the desired configuration to complete the packaged semiconductor device assembly.

One of the shortcomings of the prior art LOC semiconductor die assemblies is that the tape used to bond to the lead fingers of the leadframe does not adequately lock the lead fingers in position for the wire bonding process. At times, the adhesive on the tape is not strong enough to fix or lock the lead fingers in position for wire bonding as the lead fingers pull away from the tape before wire bonding. Alternately, the lead fingers will pull away from the tape after wire bonding of the semiconductor die but before encapsulation of the semiconductor die and leadframe either causing shorts between adjacent wire bonds or causing the wire bonds to pull loose from either the bond pads of the semiconductor die or lead finger of the leadframe. As before with conventional leadframes, with the decreasing size of the semiconductor die and the increasing amount of circuitry included in the semiconductor die it is necessary to connect an ever increasing number bond pads on the active surface of the semiconductor die with an ever increasing number of lead fingers of the lead frame. This requires that the bond pads on the semiconductor die be located on smaller pitch spacings and the width of the lead fingers be smaller. This, in turn, leads to smaller wire bonds on both the bond pads and the lead fingers of the leadframe which cause the wire bonds to be more highly stressed by the forces placed on them.

Therefore, when using copper as the metal for the formation of circuits and bond pads of a semiconductor die, a need exists for increased strength wire bonds between the lead fingers of a leadframe and the bond pads of a semiconductor die or between the conductor leads of TAB tape and the bond pads of a semiconductor die, particularly, as the size of the semiconductor die, size of the bond pads thereon, the size of the lead fingers connected by wire bonds to bond pads, and the pitch thereof, all decrease.

It is known in the art to form bumps on the bond pads of a semiconductor die using wire bonding apparatus for subsequent bond Tape Automated Bonding (TAB) or flip-chip (face-down) assembly of bare chip die to a substrate. Such is illustrated in U.S. Pat. Nos. 4,750,666 and 5,058,798. It is also known to repair defective or broken wire bonds to bond pads of semiconductor die by forming a flattened pad over the remaining portion of the wire and, subsequently, bonding the end of another wire thereover. Such is illustrated in U.S. Pat. No. 5,550,083. Other types of wire bonding operations on the bond pads of a semiconductor die are illustrated in U.S. Pat. Nos. 5,235,212, 5,298,793, 5,343,064, 5,371,654, and 5,492,863. However, such Patents use aluminum for the circuits and bond pads of the semiconductor die rather than use copper which is difficult to make effective bonds thereto using conventional processes and equipment.

SUMMARY OF THE INVENTION

The present invention relates to improved wire bonds with the bond pads of semiconductor devices and either the lead fingers of lead frames or the conductor leads of TAB tape. More specifically, the present invention relates to improved wire bonds and improved conductor lead bonds of TAB tape to the bond pads of a semiconductor device wherein the bond pads comprise a copper layer and at least one layer of metal covering a portion of the copper layer.

The present invention will be better understood when the drawings are taken in conjunction with the following description of the invention.

DESCRIPTION OF THE INVENTION

Figure 1:
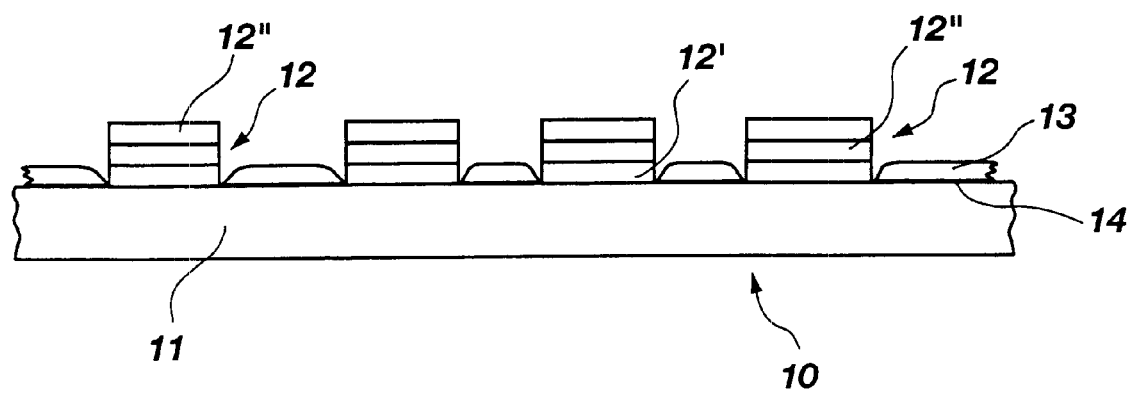
FIG. 1 is a cross-sectional view of a portion of a semiconductor die having a plurality of copper bond pads thereon having one or more layers metal thereon.

Referring to drawing FIG. 1, a portion of a semiconductor die 10 is illustrated having a plurality of bond pads 12 located on the active surface 14 thereof having a layer of insulating material 13, a passivation layer, thereon. The semiconductor device 10 may be of any desired type having any desired configuration of bond pads 12 connected to the active circuitry therein. As illustrated, bond pads 12 include a copper metal layer base 12' and one or more additional metal layers 12" thereon to facilitate the formation of an acceptable wire bonds using well known alloys of metal for the wire to the bond pads 12. The wire bond may be formed or secured to the bond pads 12 by any desired well known wire bonding apparatus used in the industry using any desired type of wire, such as aluminum, copper, copper alloy, aluminum-copper alloy, gold, silver, gold-silver alloy, platinum, etc., although gold wire is preferred to be used as gold does not form an oxide after the deposition thereof on the bond pad 12 as would aluminum, silver, etc.

As necessary, the bond pad 12 may be comprised of layers of different metals to enhance bonding characteristics. For instance, layer 12' is of copper metal such as used for the circuits of the semiconductor device 10, i.e., copper metal, a copper alloy, etc. Typically, the layer 12" would be of gold, gold alloy, silver, silver alloy, palladium and alloys thereof, noble metals and alloys thereof, nickel and alloys thereof, nickel and gold alloys, zincated copper, etc. The layer 12" may further include an additional intermediate layer of metal or other materials to help prevent intermetallic compounds from forming between the copper layer 12' and layer 12" and or for adhesion purposes. For instance, the layer 12" may commonly comprise a layer of TaN, TiN, Ni alloys, etc. If a gold wire is used for wire bonding, the metal layer 12" may typically by a gold or gold alloy metal layer. In this manner by forming the bond pad 12 of multiple layers of metal, a strong bond between the wire used for wire bonding and the copper metal layer 12' of the bond pad 12 may be formed, particularly since gold does not form an oxide coating after the deposition thereof to affect any subsequent bond of material thereto. If desired, one layer of the metal layer 12" of multiple metal layers 12" may be a layer of metal forming a barrier to prevent any copper from the layer 12' migrating therethrough or any metal of the metal layer 12" from migrating to the copper layer 12'. Additionally, one layer of the metal layer 12" may be a layer of metal for adhesion promoting purposes to either the copper layer 12' or the metal layer 12".

Figure 2A:
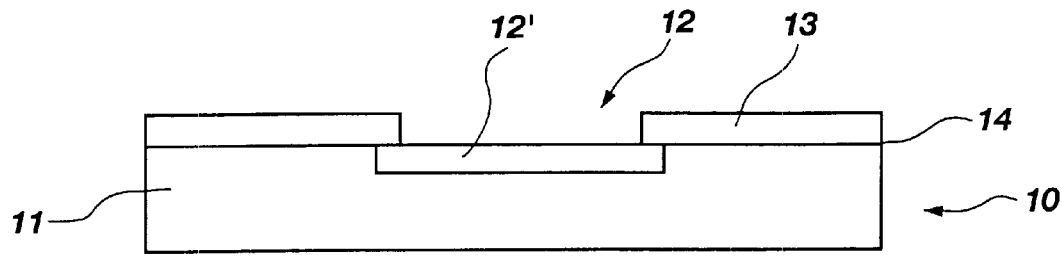
FIGS. 2A through 2F are views of a portion of a semiconductor device having a bond pad of the present invention located thereon having a wire bond formed thereon.
Figure 2B:
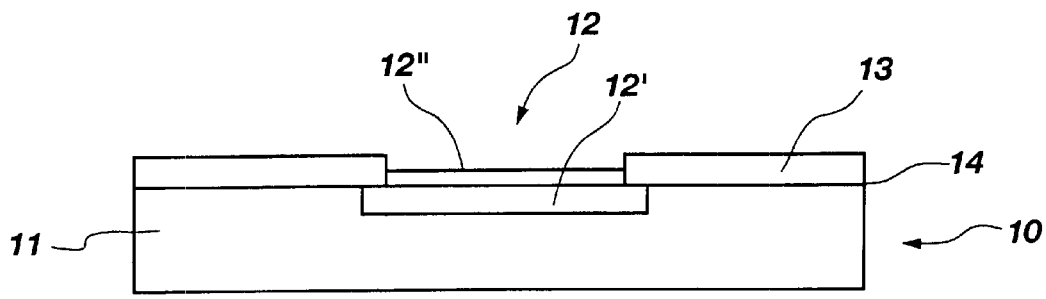
Figure 2C:
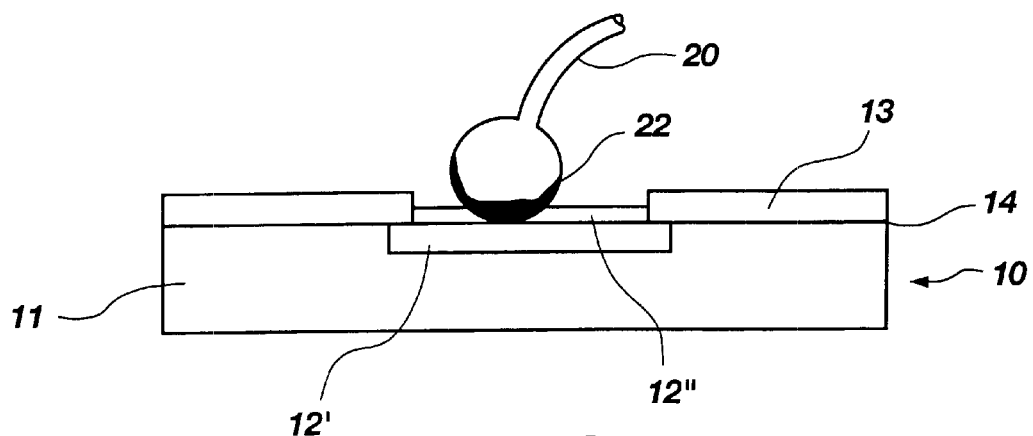

Referring to drawing FIGS. 2A through 2C, a process for forming multi-layer bond pads 12 on the active surface 14 is illustrated. A portion of a semiconductor device 10 is shown in drawing FIG. 2A having a copper layer 12' forming a portion of the bond pad 12. Illustrated in drawing FIG. 2B, is a layer of metal 12" overlying the layer 12' of the bond pad 12. The layer of metal 12" may be selectively plated by well known techniques over the copper layer 12'. The layer of metal 12" having good properties for the wire bonding of a wire 20 to the bond pad 12. Illustrated in drawing FIG. 2C, a wire 20 is bonded by well known wire bonding apparatus to the layer of metal 12" of the bond pad 12 using a wire bond ball 22.

Still referring to drawing FIGS. 2A through 2C, a portion of a semiconductor device 10 is shown having a bond pad 12 thereon with the copper layer 12' located thereon having the upper surface thereof located at approximately the same level as the active surface 14 to the device 10, the surface 14 having a layer of insulation (typically a passivation layer of an insulating oxide or insulating nitride) 13 thereon. As illustrated in drawing FIG. 2B, the copper layer 12' of bond pad 12 has a suitable metal layer 12" selectively plated thereon using well known plating processes. The function of the metal layer 12" being to provide a good metal to which an effective wire bond may be formed using well known wire bonding apparatus. Illustrated in drawing FIG. 2C, a wire 20 is wire bonded to metal layer 12" using a ball 22 formed on the end of the wire 20 using any well known suitable wire bonding apparatus. In the wire bonding process, the portion of the metal layer 12" on the bond pad 12 located under ball 22 of the wire 20 of the wire bond thereto may be consumed during the wire bonding process thereby allowing the ball 22 of the wire 20 of the wire bond to make direct contact with the copper layer 12' of the bond pad 12. For example, when the metal layer 12" is gold and the ball 22 of wire 20 is gold wire, the metal layer 12" located under the ball 22 will become part of the ball 22 during the wire bonding process with the ball 22 being bonded to the copper layer 12' of the bond pad 12.

Figure 2D:
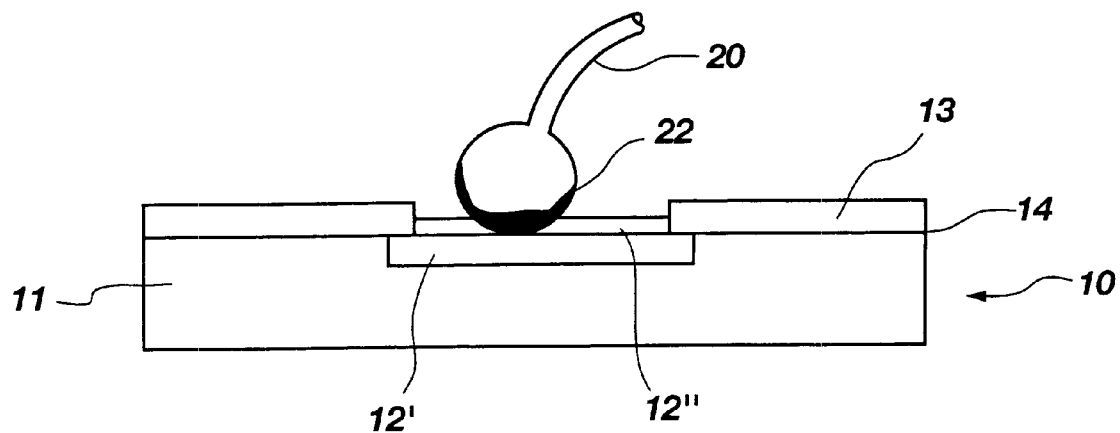

Referring to drawing FIG. 2D, a wire 20 is wired bonded to copper layer 12' with the ball 22 on the end of wire 20 consuming or adding part of the metal layer 12" during the bonding process forming the ball 22 on the end of wire 20 connecting the wire 20 to the copper layer 12'.

Figure 2E:
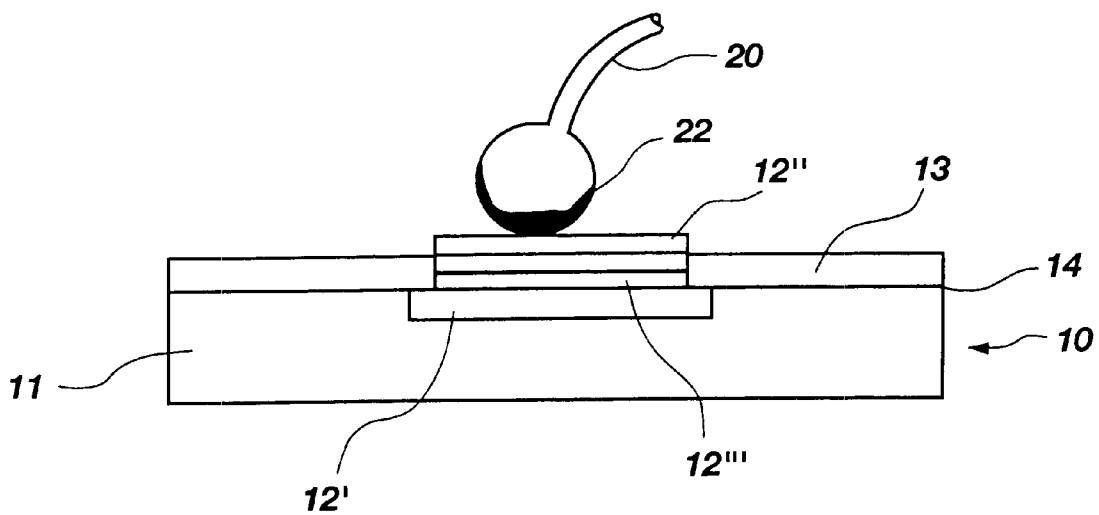

Referring to drawing FIG. 2E, a portion of a semiconductor device 10 is shown having a bond pad 12 thereon with the copper layer 12' located thereon having the upper surface thereof located at approximately the same level as the active surface 14 to the device 10, the surface 14 having a layer of insulation (typically a passivation layer of an insulating oxide or insulating nitride) 13 thereon. As illustrated in drawing FIG. 2E, the copper layer 12' of bond pad 12 has a barrier layer 12''' formed of a suitable material having a suitable metal layer 12" selectively plated thereon using well known plating processes. The function of the barrier layer 12''' being to help prevent interaction between the copper layer 12' and the suitable metal layer 12" of the bond pad 12 and/or to help prevent or decrease the growth of intermetallics between the metal layer 12' and the metal layer 12". For instance, barrier materials, such as titanium, tungsten, tantalum, nickel, tantalum-nickel alloys, titanium-nickel alloys, titanium-tungsten alloys, etc. are frequently used in conjunction with aluminum alloy interconnects. In other instances, a barrier layer of nickel between copper and tin will decrease the growth of tin-copper intermetallics. The layers of metal forming the bond pads 12 also occasionally are silicided, or have a refractory interconnect material, such as molybdenum, tungsten, or tungsten silicide as part thereof. The function of the metal layer 12" being to provide a good metal to which an effective wire bond may be formed using well known wire bonding apparatus, such as a metal layer 12" of gold when gold wire 20 is being used for wire bonding.

Figure 2F:
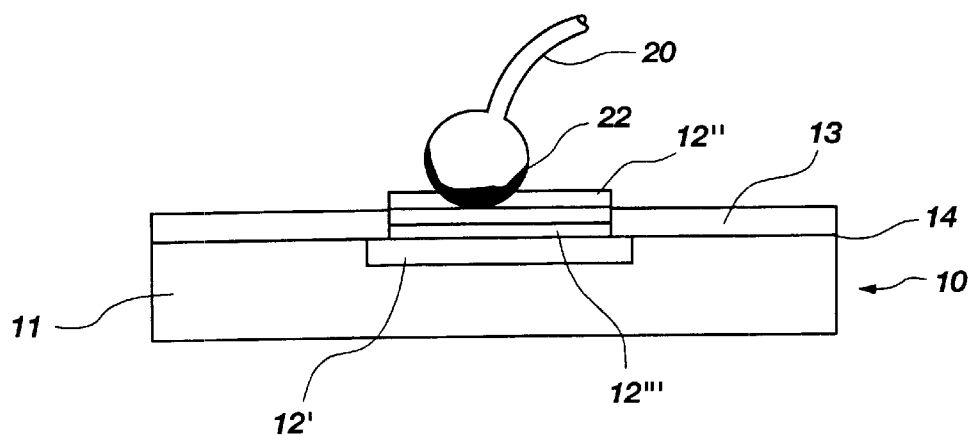

Referring to drawing FIG. 2F, a wire 20 is wired bonded to barrier layer 12''' with the ball 22 on the end of wire 20 consuming part of the metal layer 12" during the bonding process forming the ball 22 on the end of wire 20 connecting the wire 20 to the barrier layer 12'''.

Figure 3A:
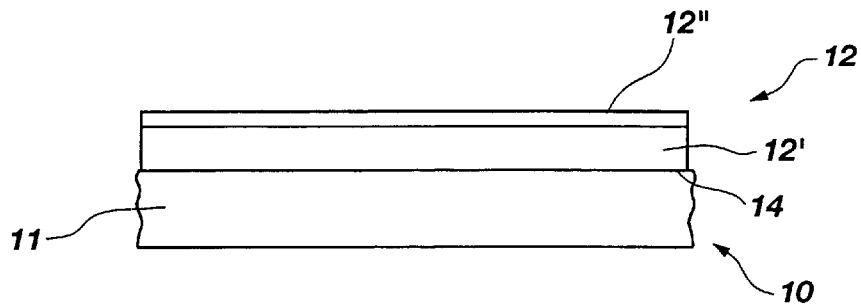
FIGS. 3A through 3C are view of a portion of a semiconductor device illustrating the formation of a bond pad thereon of the present invention having a wire bond formed thereon.
Figure 3B:
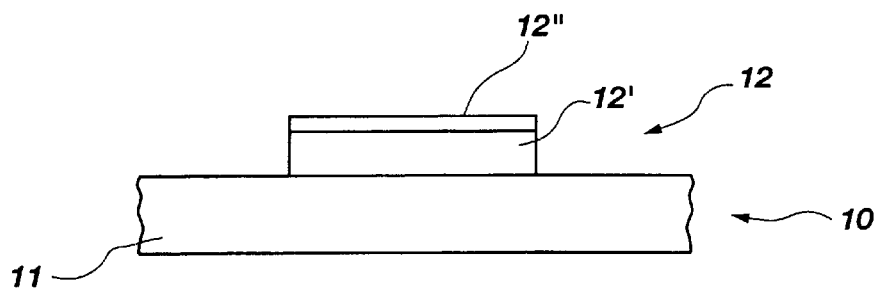
Figure 3C:
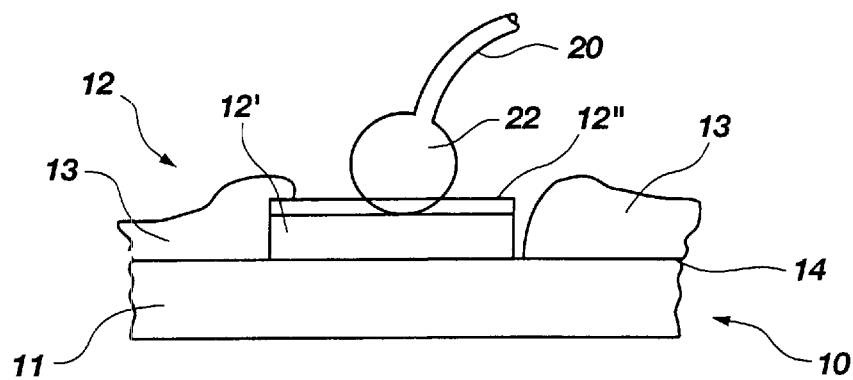

Referring to drawing FIGS. 3A through 3C, a portion of a semiconductor device 10 is shown wherein a layer of copper 12' is deposited on the substrate 11 using any desired well known process having a thin layer of metal 12", as described hereinbefore, deposited thereon. The thin layer of metal 12" may be deposited on the copper layer 12' be any well known process, such a sputter deposition, electrodeposited, electroless deposition, etc.

Referring to drawing FIG. 3B, the portion of the semiconductor device 10 is shown after the copper layer 12' and layer of metal 12" deposited thereon have been patterned using well known techniques to apply a photoresist in a desired pattern with the subsequent etching of the copper layer 12' and layer of metal 12" to form a bond pad 12 on the substrate 11 of the semiconductor device 10. The copper layer 12' and layer of metal 12" deposited thereon may be any desired shape, size, and number for the desired number of bond pads 12 on the substrate 11. Further, the copper layer 12' may include at least two or more layers of metal with the upper layer being a copper layer thereby forming a stack of layers of differing metal with the upper layer being a copper layer.

Referring to drawing FIG. 3C, a portion of the semiconductor device 10 is shown having a wire 20 bonded to the layer of metal 12" of the bond pad 12 using a ball type bond 22 thereto for wire bonding using any desired well known wire bonding apparatus. The semiconductor substrate 11 includes a layer of insulating material 13, as described hereinbefore, on active surface 14 thereof surrounding the bond pad 12.

Figure 4A:
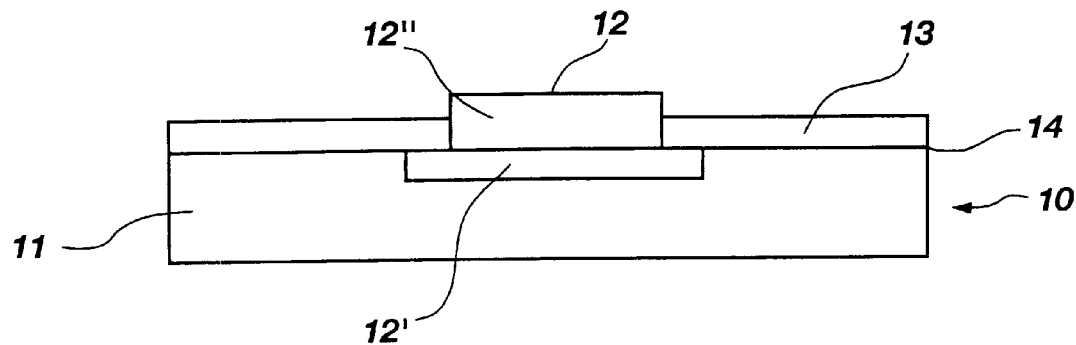
FIGS. 4A through 4D are views of a portion of a semiconductor device having a bond pad of the present invention located thereon with a conductor lead of a TAB tape bonded thereto.

Referring to drawing FIGS. 4A through 4D, in drawing FIG. 4A, a portion of a semiconductor device 10 is shown having a bond pad 12 thereon with the copper layer 12' located thereon having the upper surface thereof located at approximately the same level as the active surface 14 to the device 10, the surface 14 having a layer of insulation (typically a passivation layer of an insulating oxide or insulating nitride) 13 thereon. Also illustrated in drawing FIG. 4A, the copper layer 12' of bond pad 12 has a suitable metal layer 12" selectively plated thereon using well known plating processes. The function of the metal layer 12" being to provide a good metal to which an effective wire bond may be formed using well known wire bonding apparatus.

Figure 4B:
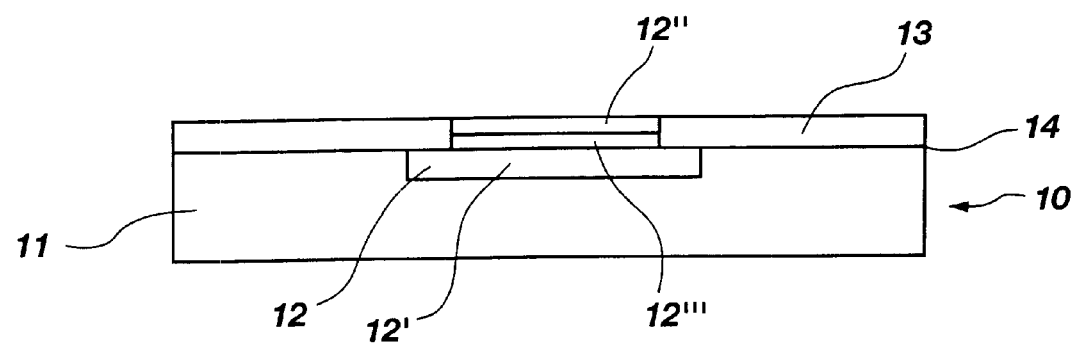

Illustrated in drawing FIG. 4B, the copper layer 12' of bond pad 12 has a suitable barrier layer 12''' located between the copper layer 12' and the suitable metal layer 12", such as described hereinbefore.

Figure 4C:
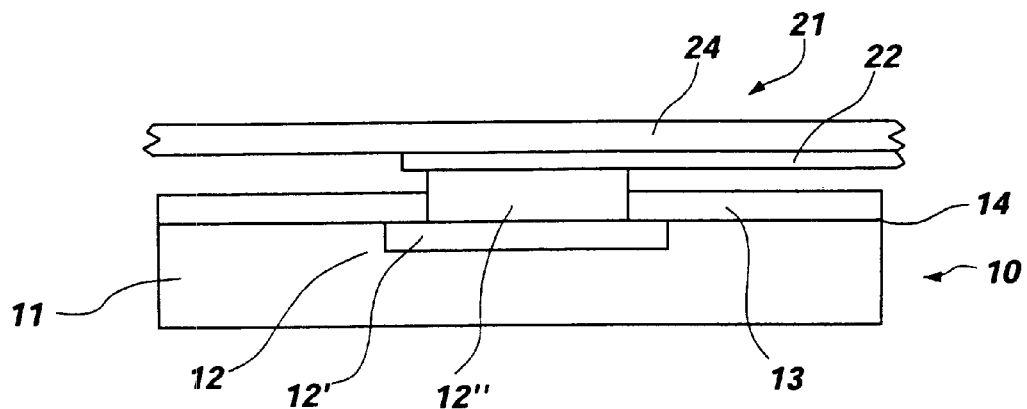

Referring to drawing FIG. 4C, a portion of a semiconductor device 10 is shown having a bond pad 12 thereon having a copper layer 12' located thereon having a portion bonded thereto of a conductor lead 22 (numeral 22 previously referred to as "ball 22") located on a portion of a substrate 24 of a portion of a TAB tape 21. The surface 14 of substrate 11 of the semiconductor device 10 has a layer of insulation (typically a passivation layer of an insulating oxide or insulating nitride) 13 thereon. Also illustrated in drawing FIG. 4C, the function of the metal layer 12" is to provide a good metal to which an effective bond may be formed using well known wire bonding apparatus to the conductive lead 22 of the TAB tape 20. The conductive lead 22 of the TAB tape may be of any suitable metal, such as copper, copper alloys, etc. The metal layer 12" may be of any suitable metal, such as described herein.

Figure 4D:
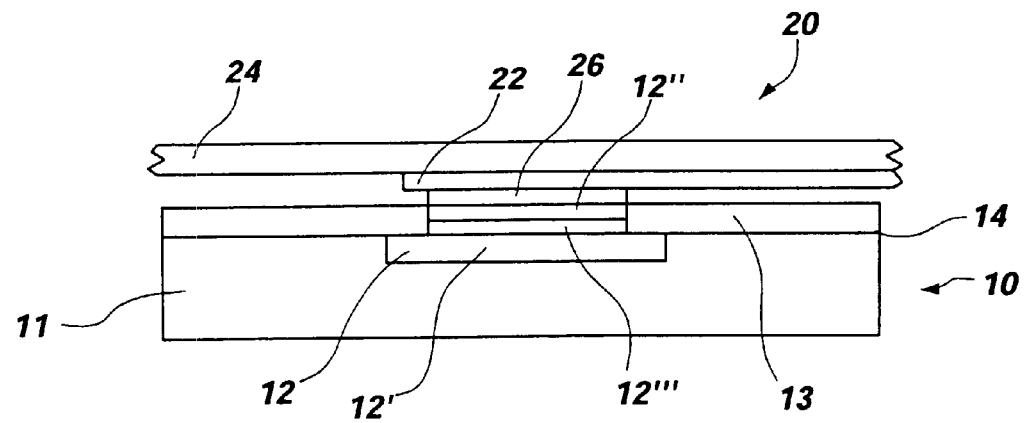

Referring to drawing FIG. 4D, a portion of a semiconductor device 10 is shown having a bond pad 12 thereon having a copper layer 12' located thereon having a barrier layer 12''' located thereon having, in turn, a metal layer 12" located thereon. The metal layer 12" of the bond pad 12 is bonded to a portion of a conductor lead 22 located on a portion of a substrate 24 of a portion of a TAB tape 21. The conductor lead 22 of the portion of the TAB tape 21 including a layer 26 of suitable metal located thereon for the bonding of the conductor lead 22 to the metal layer 12" of the bond pad 12 of the semiconductor device 10. The surface 14 of the portion of the semiconductor device 10 having a layer of insulation (typically a passivation layer of an insulating oxide or insulating nitride) 13 thereon. Also illustrated in drawing FIG. 4D, the function of the metal layer 12" is to provide a good metal to which an effective bond may be formed using well known bonding apparatus to the metal layer 26 of the conductive lead 22 of the TAB tape 20. The metal layer 24 and metal layer 26 may be of any suitable metal for bonding purposes, such as gold, alloys of gold, etc. The conductive lead 22 of the TAB tape may be of any suitable metal, such as copper, copper alloys, etc. The metal layer 12" may be of any suitable metal, such as described herein. The barrier layer 12''' may be of any suitable metal or material, such as described herein.

Referring to drawing FIGS. 5A through 5J, various differing processes for the formation of the bond pad 12 including a copper layer 12' and a layer of metal 12" and, if desired, a barrier layer 12''' are illustrated.

Figure 5A:
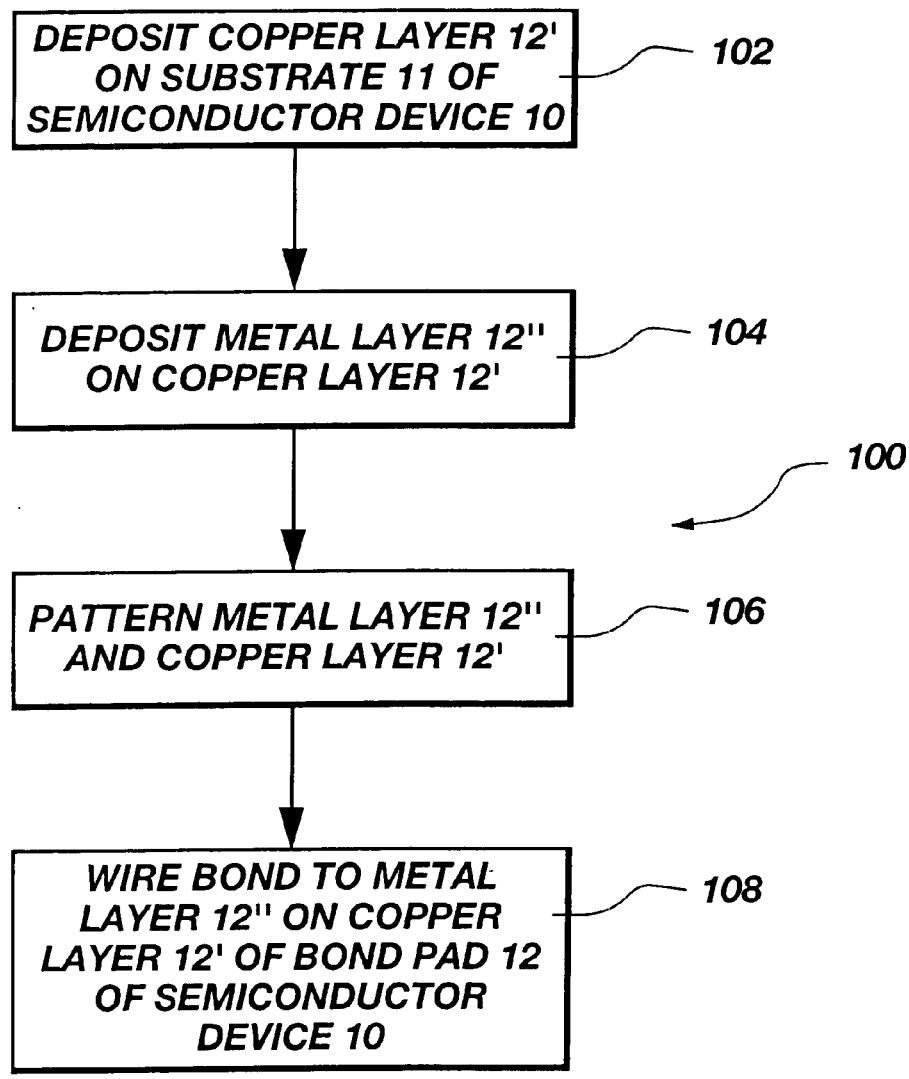
FIGS. 5A through 5J are drawings illustrating processes of forming a bond pad of the present invention on a semiconductor device and a subsequent wire bond and bond of a conductor lead of a TAB tape therewith.

Referring to drawing FIG. 5A, a process 100 for the formation of a bond pad 12 including a copper layer 12' and a layer of metal 12" thereon for wire bonding purposes as described hereinbefore is illustrated. As illustrated in step 102, a substrate 11 as described hereinbefore for a semiconductor device 10 has a layer of copper or copper alloy 12' deposited thereon using any desired deposition process. Subsequently, in step 104, a layer of metal 12" is deposited on the copper layer 12' using any well known deposition process for deposition. Then, in step 106, the copper layer 12' and layer of metal 12' is patterned and etched to form the desired shape, number, and pattern for the bond pads 12 on the active surface 14 of the substrate 11 of the semiconductor device 10. A layer of insulation 13 is typically applied to the active surface 14 of the substrate 11 to protect the circuitry formed thereon of the semiconductor device 10. After the completion of the semiconductor device 10 having bond pads 12 including a copper layer 12' and layer of metal 12" thereon, the semiconductor device may be assembled to a lead frame (not shown) for wire bonding a wire 20 to the bond pad 12 of the semiconductor device 10 using any suitable wire bonding process 108 and apparatus.

Figure 5B:
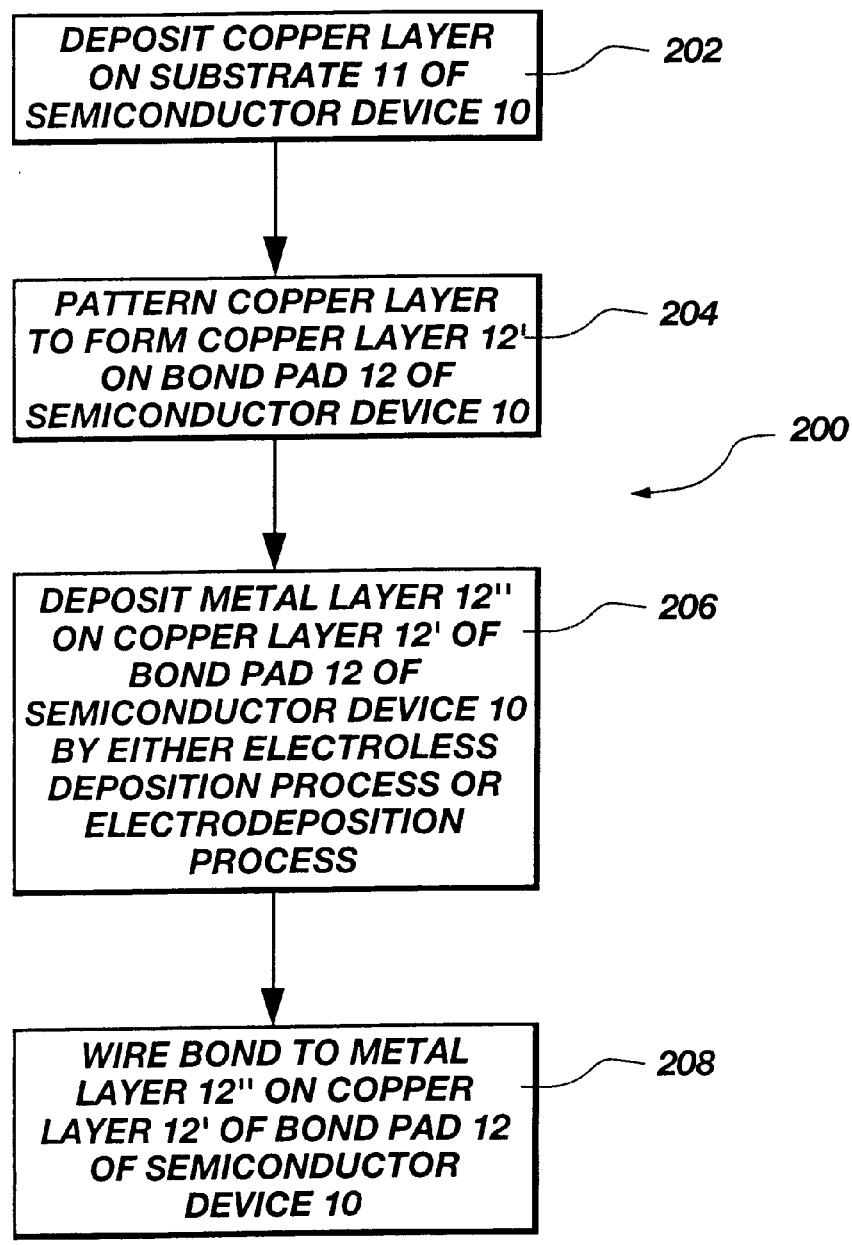

Referring to drawing FIG. 5B, a process 200 for the formation of a bond pad 12 including a copper layer 12' and a layer of metal 12" thereon for wire bonding purposes as described hereinbefore is illustrated. As illustrated in step 202, a substrate 11 as described hereinbefore for a semiconductor device 10 has a layer of copper or copper alloy 12' deposited thereon using any desired deposition process. Subsequently, in step 204, the copper layer 12' is patterned and etched to form the desired shape, number, and pattern for the bond pads 12 on the active surface 14 of the substrate 11 of the semiconductor device 10. Then, in step 206, the layer of metal 12" is deposited on the copper layer 12' using any desired deposition process, as described hereinbefore, such as electrodepositon, electroless deposition, etc. to form the bond pad 12 having a copper layer 12' and layer of metal 12" thereon for good wire bonding properties. A layer of insulation 13 is typically applied to the active surface 14 of the substrate 11 to protect the circuitry formed thereon of the semiconductor device 10. After the completion of the semiconductor device 10 having bond pads 12 including a copper layer 12' and layer of metal 12" thereon, the semiconductor device may be assembled to a lead frame (not shown) for wire bonding a wire 20 to the bond pad 12 of the semiconductor device 10 using any suitable wire bonding process 208 and apparatus.

Figure 5C:
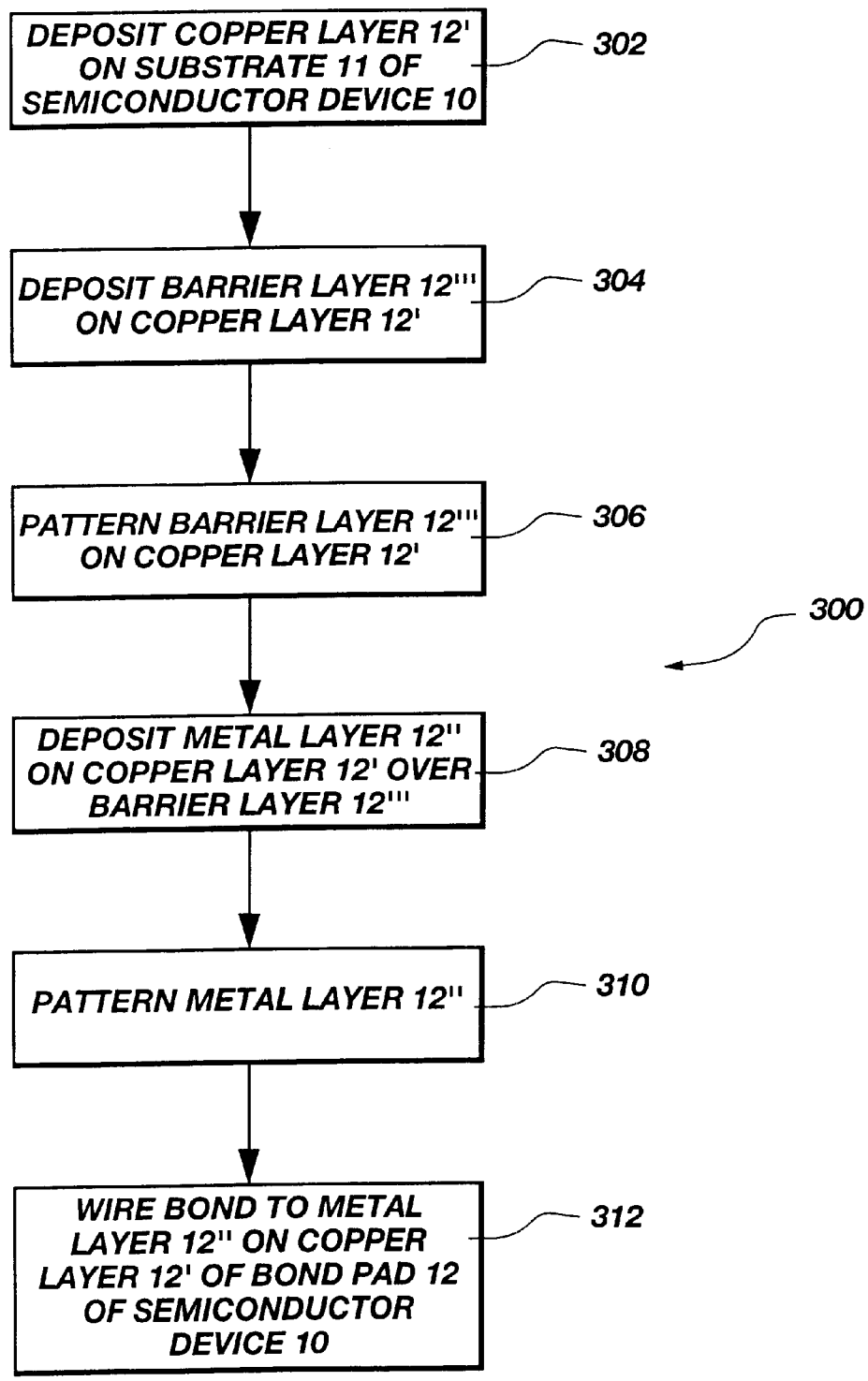

Referring to drawing FIG. 5C, a process 300 for the formation of a bond pad 12 including a copper layer 12', a barrier layer 12''', and a layer of metal 12" thereon for wire bonding purposes as described hereinbefore is illustrated. As illustrated in step 302, a substrate 11 as described hereinbefore for a semiconductor device 10 has a layer of copper or copper alloy 12' deposited thereon using any desired deposition process. Subsequently, in step 304, a barrier layer 12''' of suitable material is deposited on the copper layer 12' using any well known deposition process for deposition. Then, in step 306, the copper layer 12' and barrier layer 12''' are patterned and etched to form the desired shape, number, and pattern for the bond pads 12 on the active surface 14 of the substrate 11 of the semiconductor device 10. Then a metal layer 12" is deposited in step 308 over the barrier layer 12''' and subsequently patterned in step 310. A layer of insulation 13 is typically applied to the active surface 14 of the substrate 11 to protect the circuitry formed thereon of the semiconductor device 10. After the completion of the semiconductor device 10 having bond pads 12 including a copper layer 12', barrier layer 12''', and layer of metal 12" thereon, the semiconductor device may be assembled to a lead frame (not shown) for wire bonding a wire 20 to the bond pad 12 of the semiconductor device 10 using any suitable wire bonding process 312 and apparatus.

Figure 5D:
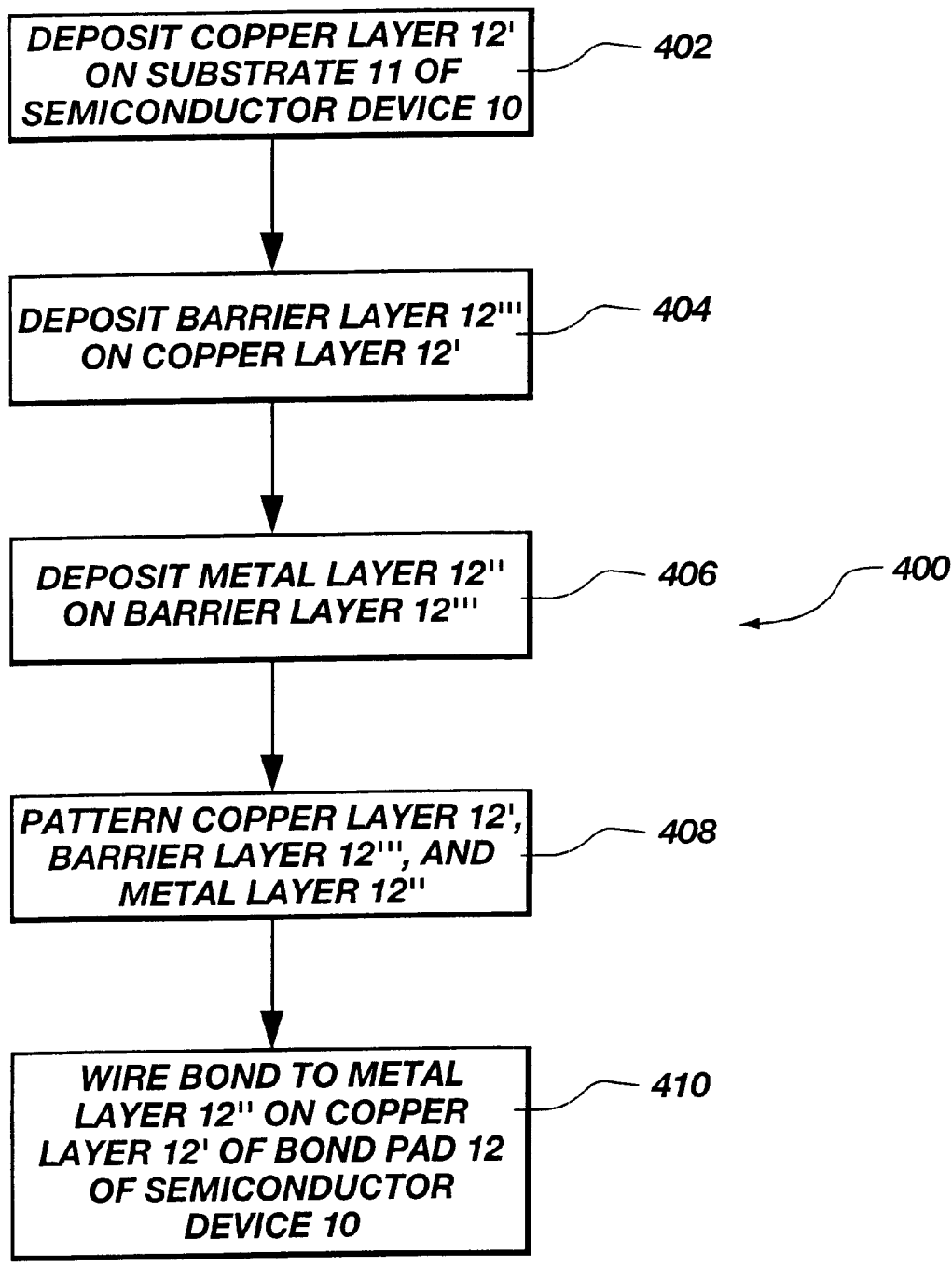

Referring to drawing FIG. 5D, a process 400 for the formation of a bond pad 12 including a copper layer 12', a barrier layer 12''', and a layer of metal 12" thereon for wire bonding purposes as described hereinbefore is illustrated. As illustrated in step 402, a substrate 11 as described hereinbefore for a semiconductor device 10 has a layer of copper or copper alloy 12' deposited thereon using any desired deposition process. Subsequently, in step 404, a barrier layer 12''' of suitable material is deposited on the copper layer 12' using any well known deposition process for deposition. Then, in step 406, a metal layer 12" is deposited on the barrier layer 12'''. In step 408, the copper layer 12', barrier layer 12''', and metal layer 12" are patterned and etched to form the desired shape, number, and pattern for the bond pads 12 on the active surface 14 of the substrate 11 of the semiconductor device 10. A layer of insulation 13 is typically applied to the active surface 14 of the substrate 11 to protect the circuitry formed thereon of the semiconductor device 10. After the completion of the semiconductor device 10 having bond pads 12 including a copper layer 12', barrier layer 12''', and layer of metal 12" thereon, the semiconductor device may be assembled to a lead frame (not shown) for wire bonding a wire 20 to the bond pad 12 of the semiconductor device 10 using any suitable wire bonding process 410 and apparatus.

Figure 5E:
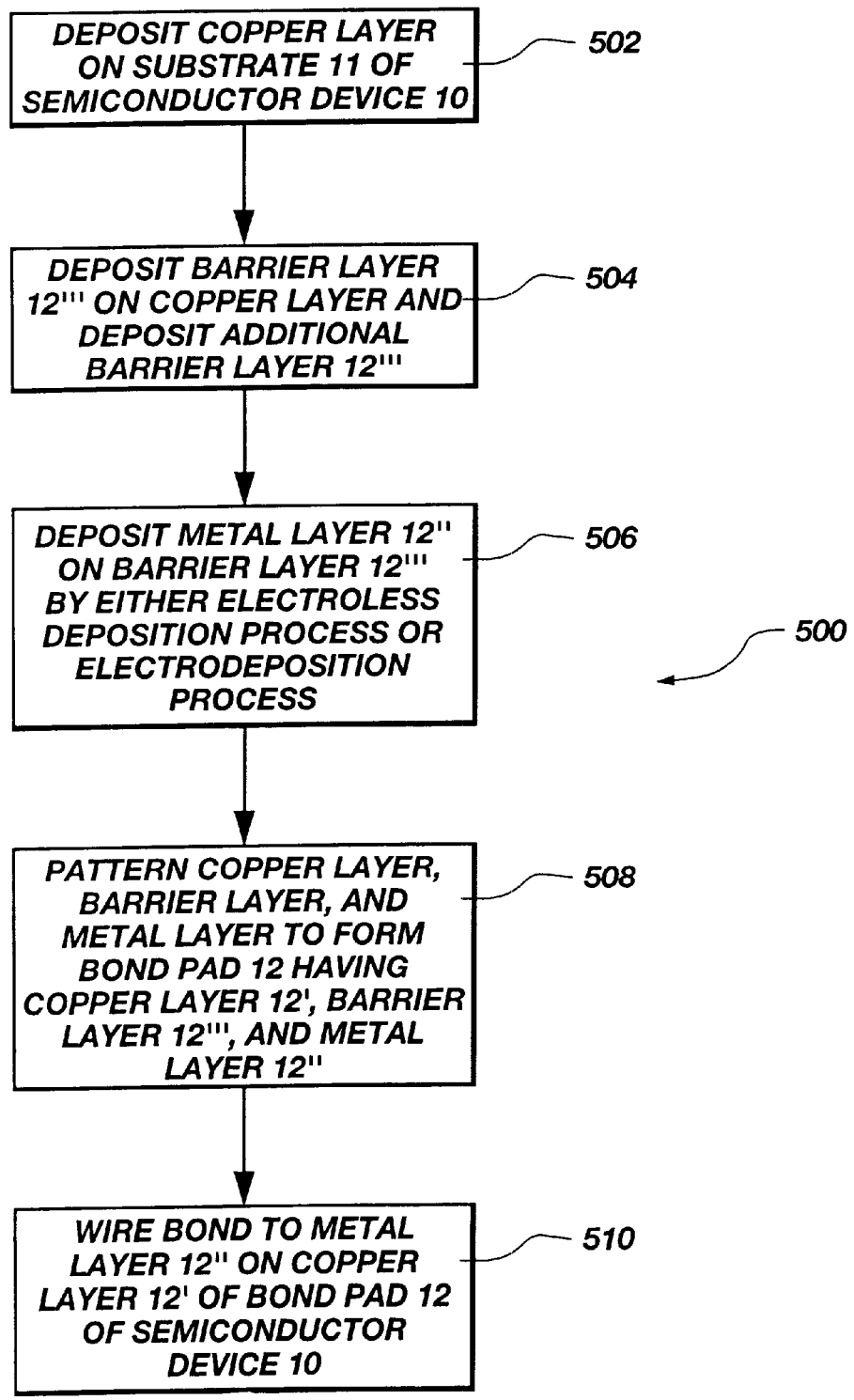

Referring to drawing FIG. 5E, a process 500 for the formation of a bond pad 12 including a copper layer 12' and a layer of metal 12" thereon for wire bonding purposes as described hereinbefore is illustrated. As illustrated in step 502, a substrate 11 as described hereinbefore for a semiconductor device 10 has a layer of copper or copper alloy 12' deposited thereon using any desired deposition process. Subsequently, in step 504, at least two barrier layers 12''' are deposited on the copper layer. In step 506, a metal layer 12" is deposited on the barrier layer 12''' using any desired deposition process, as described hereinbefore, such as electrodepositon, electroless deposition, etc. In step 508, the copper layer 12', barrier layer 12''', and metal layer 12" are patterned to form the bond pad 12 having a copper layer 12', barrier layer 12''', and layer of metal 12" thereon for good wire bonding properties. A layer of insulation 13 is typically applied to the active surface 14 of the substrate 11 to protect the circuitry formed thereon of the semiconductor device 10. After the completion of the semiconductor device 10 having bond pads 12 including a copper layer 12', at least two barrier layers 12''', and layer of metal 12'' thereon, the semiconductor device may be assembled to a lead frame (not shown) for wire bonding a wire 20 to the bond pad 12 of the semiconductor device 10 using any suitable wire bonding process 510 and apparatus.

Referring to drawing FIGS. 5F through 5J, the processes set forth therein are similar to those described regarding those illustrated in drawing FIGS. 5A through 5E, except that a conductor lead of a TAB tape is bonded to the bond pad 12 of the semiconductor device 10, rather than a wire bond being made to the bond pad 12 of a semiconductor device 10.

Figure 5F:
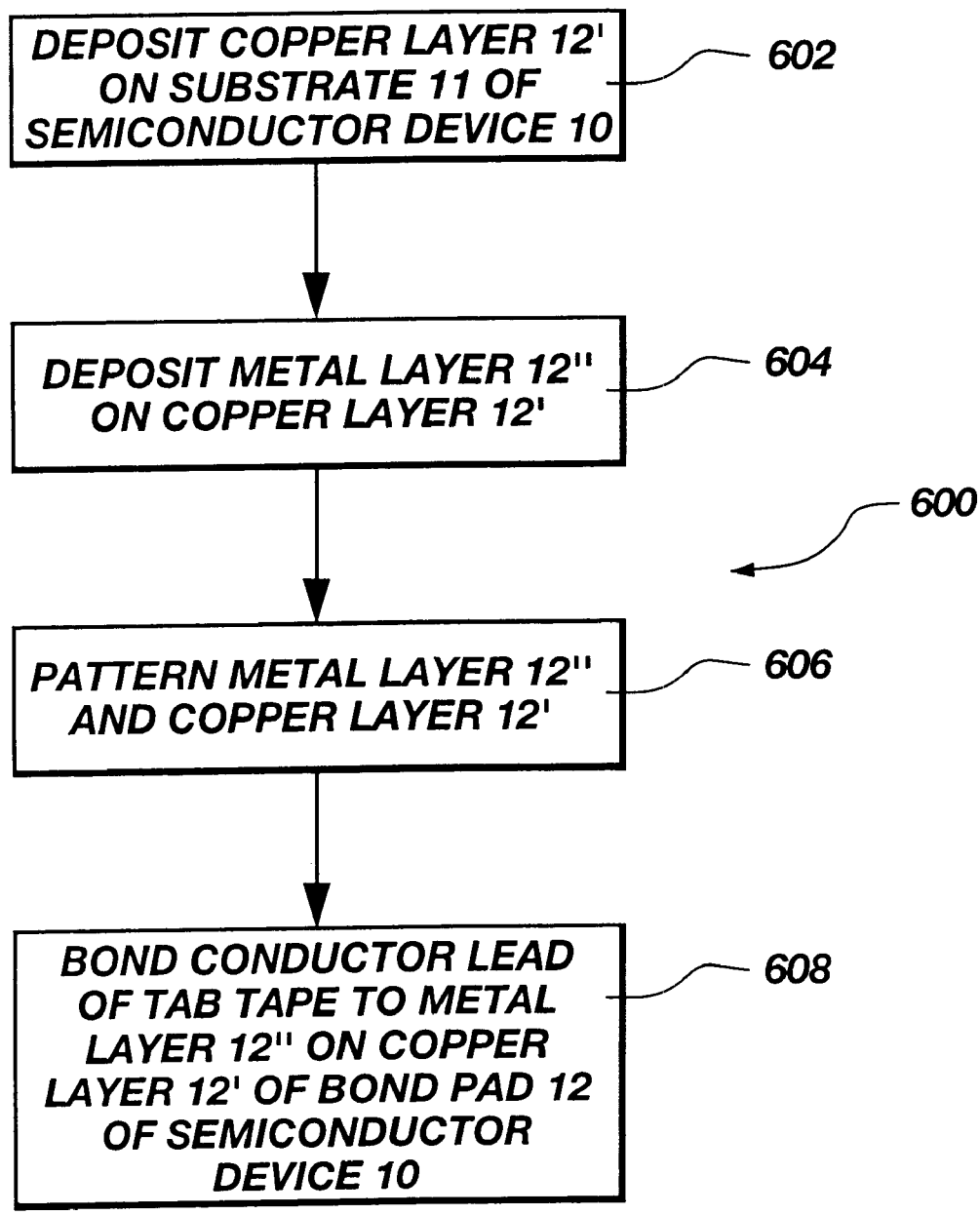

Referring to drawing FIG. 5F, a process 600 for the formation of a bond pad 12 including a copper layer 12' and a layer of metal 12'' thereon for conductor lead of TAB tape bonding purposes as described hereinbefore is illustrated. As illustrated in step 602, a substrate 11 as described hereinbefore for a semiconductor device 10 has a layer of copper or copper alloy 12' deposited thereon using any desired deposition process. Subsequently, in step 604, a layer of metal 12'' is deposited on the copper layer 12' using any well known deposition process for deposition. Then, in step 606, the copper layer 12' and layer of metal 12'' is patterned and etched to form the desired shape, number, and pattern for the bond pads 12 on the active surface 14 of the substrate 11 of the semiconductor device 10. A layer of insulation 13 is typically applied to the active surface 14 of the substrate 11 to protect the circuitry formed thereon of the semiconductor device 10. After the completion of the semiconductor device 10 having bond pads 12 including a copper layer 12' and layer of metal 12'' thereon, the semiconductor device may be assembled to a conductor lead of a TAB tape (not shown) for bonding a conductor lead to the bond pad 12 of the semiconductor device 10 using any suitable bonding process 608 and apparatus.

Figure 5G:
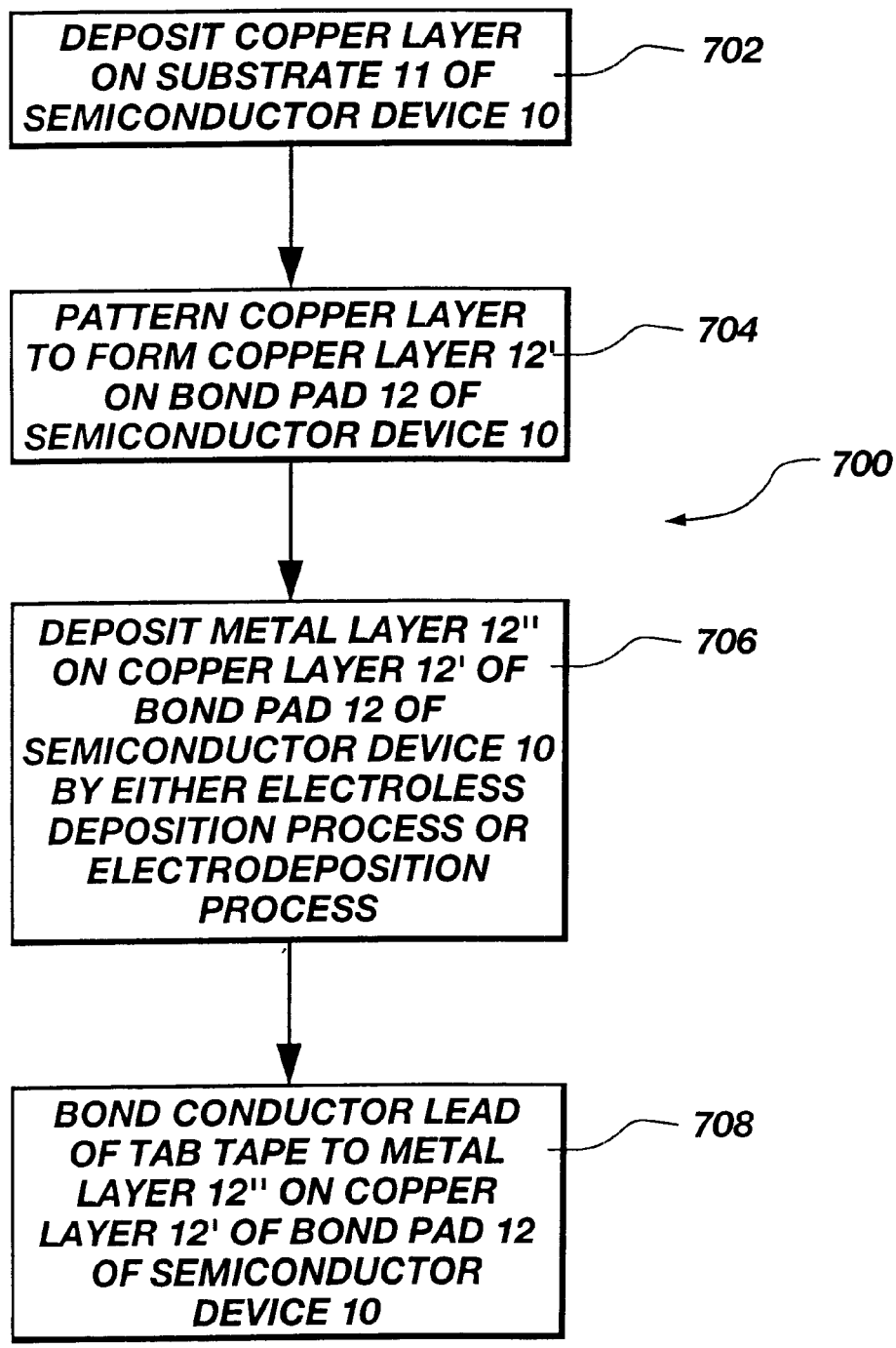

Referring to drawing FIG. 5G, a process 700 for the formation of a bond pad 12 including a copper layer 12' and a layer of metal 12'' thereon for conductor lead of TAB tape bonding purposes as described hereinbefore is illustrated. As illustrated in step 702, a substrate 11 as described hereinbefore for a semiconductor device 10 has a layer of copper or copper alloy 12' deposited thereon using any desired deposition process. Subsequently, in step 704, the copper layer 12' is patterned and etched to form the desired shape, number, and pattern for the bond pads 12 on the active surface 14 of the substrate 11 of the semiconductor device 10. Then, in step 706, the layer of metal 12'' is deposited on the copper layer 12' using any desired deposition process, as described hereinbefore, such as electrodepositon, electroless deposition, etc. to form the bond pad 12 having a copper layer 12' and layer of metal 12'' thereon for good wire bonding properties. A layer of insulation 13 is typically applied to the active surface 14 of the substrate 11 to protect the circuitry formed thereon of the semiconductor device 10. After the completion of the semiconductor device 10 having bond pads 12 including a copper layer 12' and layer of metal 12'' thereon, the semiconductor device may be assembled to a conductor lead of a TAB tape (not shown) for wire bonding a conductor lead to the bond pad 12 of the semiconductor device 10 using any suitable bonding process 708 and apparatus.

Figure 5H:
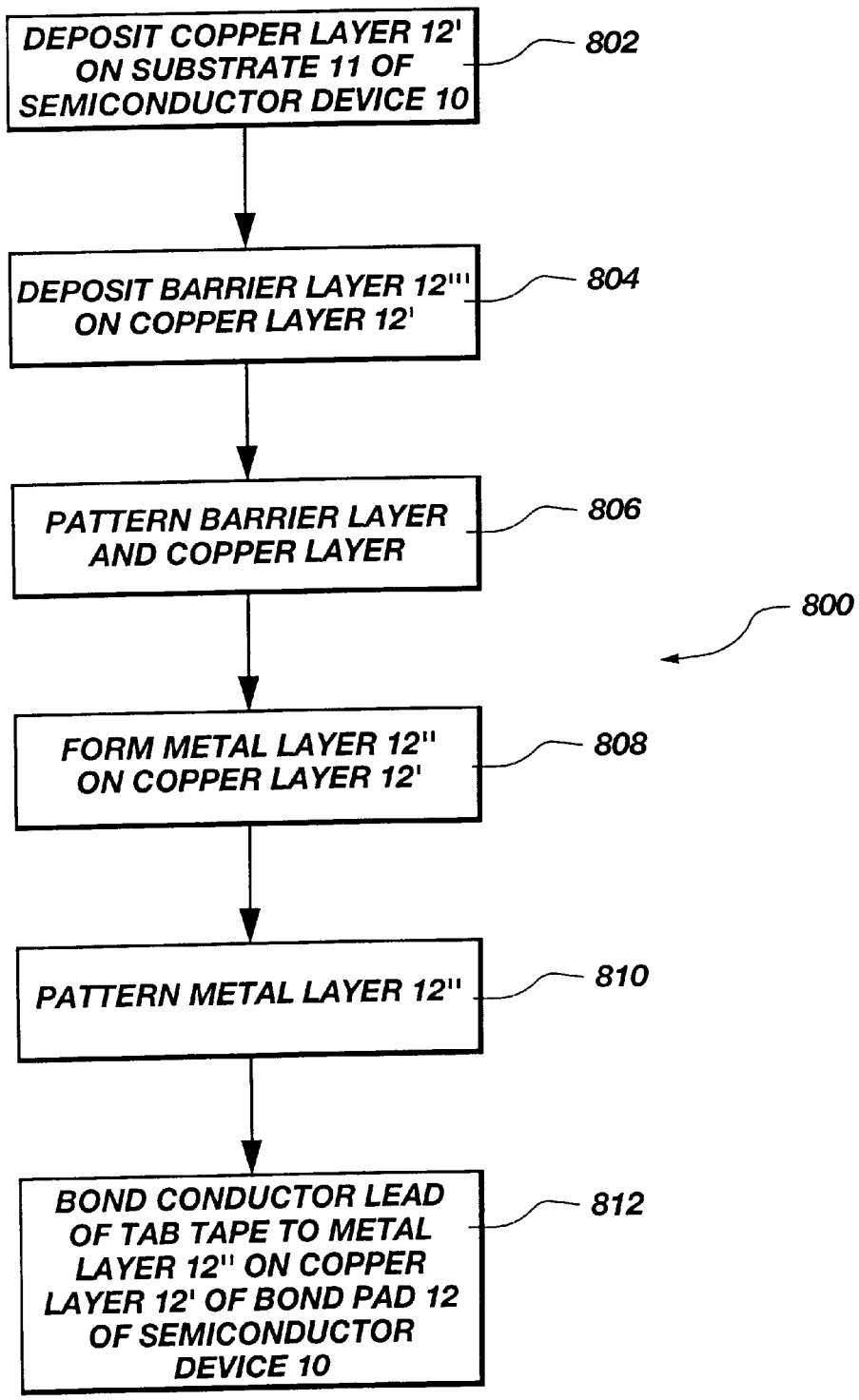

Referring to drawing FIG. 5H, a process 800 for the formation of a bond pad 12 including a copper layer 12', a barrier layer 12''', and a layer of metal 12'' thereon for conductor lead of TAB tape bonding purposes as described hereinbefore is illustrated. As illustrated in step 802, a substrate 11 as described hereinbefore for a semiconductor device 10 has a layer of copper or copper alloy 12' deposited thereon using any desired deposition process. Subsequently, in step 804, a barrier layer 12''' of suitable material is deposited on the copper layer 12' using any well known deposition process for deposition. Then, in step 806, the copper layer 12' and barrier layer 12''' are patterned and etched to form the desired shape, number, and pattern for the bond pads 12 on the active surface 14 of the substrate 11 of the semiconductor device 10. Then a metal layer 12'' is deposited in step 808 over the barrier layer 12''' and subsequently patterned in step 810. A layer of insulation 13 is typically applied to the active surface 14 of the substrate 11 to protect the circuitry formed thereon of the semiconductor device 10. After the completion of the semiconductor device 10 having bond pads 12 including a copper layer 12', barrier layer 12''', and layer of metal 12'' thereon, the semiconductor device may be assembled to a conductor lead of a TAB tape (not shown) for bonding a conductor lead to the bond pad 12 of the semiconductor device 10 using any suitable bonding process 812 and apparatus.

Figure 5I:
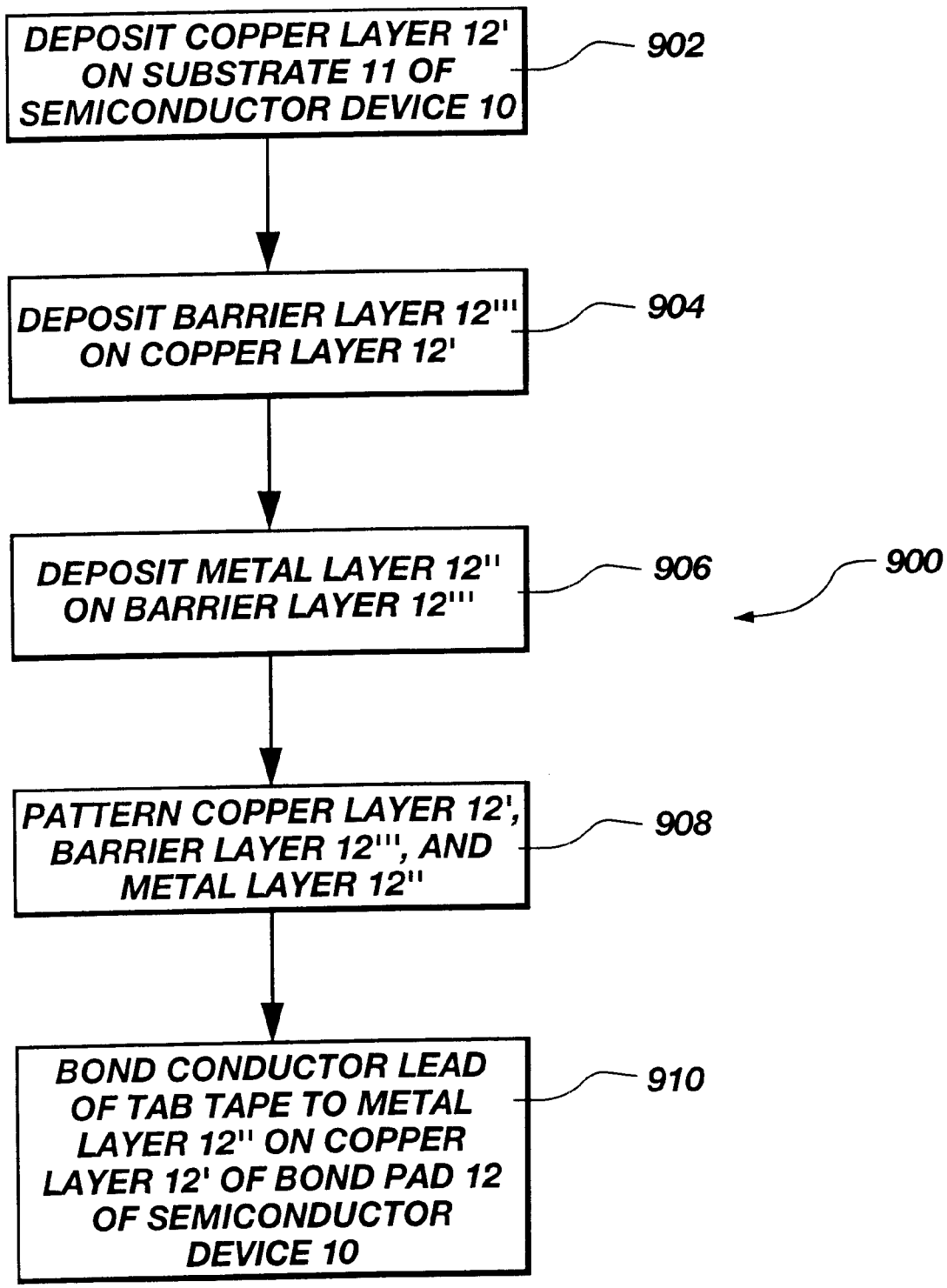

Referring to drawing FIG. 5I, a process 900 for the formation of a bond pad 12 including a copper layer 12', a barrier layer 12''', and a layer of metal 12'' thereon for conductor lead of TAB tape bonding purposes as described hereinbefore is illustrated. As illustrated in step 902, a substrate 11 as described hereinbefore for a semiconductor device 10 has a layer of copper or copper alloy 12' deposited thereon using any desired deposition process. Subsequently, in step 904, a barrier layer 12''' of suitable material is deposited on the copper layer 12' using any well known deposition process for deposition. Then, in step 906, a metal layer 12'' is deposited on the barrier layer 12'''. In step 908, the copper layer 12', barrier layer 12''', and metal layer 12'' are patterned and etched to form the desired shape, number, and pattern for the bond pads 12 on the active surface 14 of the substrate 11 of the semiconductor device 10. A layer of insulation 13 is typically applied to the active surface 14 of the substrate 11 to protect the circuitry formed thereon of the semiconductor device 10. After the completion of the semiconductor device 10 having bond pads 12 including a copper layer 12', barrier layer 12''', and layer of metal 12'' thereon, the semiconductor device may be assembled to a conductor lead of a TAB tape (not shown) for bonding a conductor lead to the bond pad 12 of the semiconductor device 10 using any suitable bonding process 910 and apparatus.

Figure 5J:
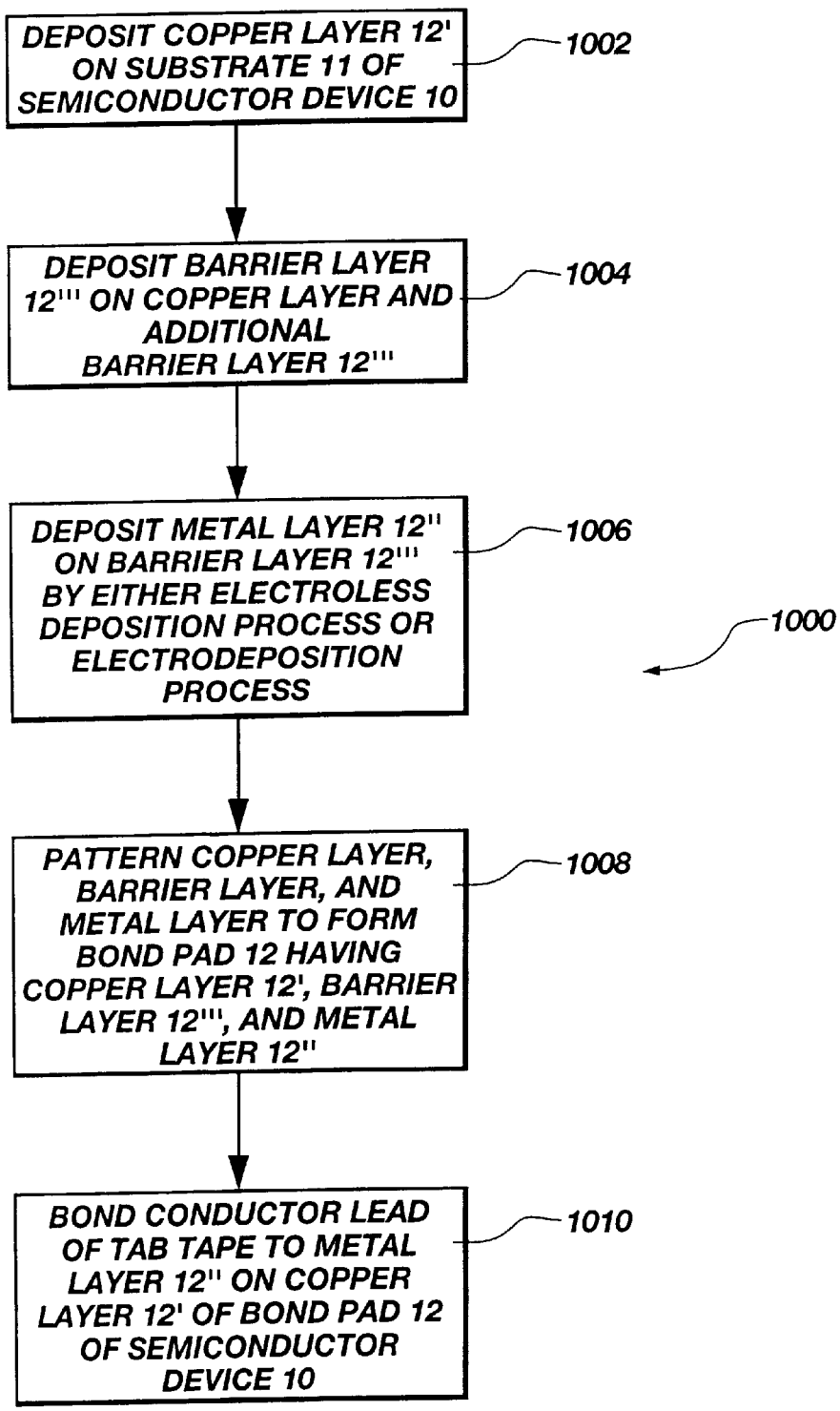

Referring to drawing FIG. 5J, a process 1000 for the formation of a bond pad 12 including a copper layer 12' and a layer of metal 12'' thereon for conductor lead of TAB tape bonding purposes as described hereinbefore is illustrated. As illustrated in step 1002, a substrate 11 as described hereinbefore for a semiconductor device 10 has a layer of copper or copper alloy 12' deposited thereon using any desired deposition process. Subsequently, in step 1004, at least two barrier layers 12''' are deposited on the copper layer. In step 1006, a metal layer 12'' is deposited on the barrier layer 12''' using any desired deposition process, as described hereinbefore, such as electrodepositon, electroless deposition, etc. In step 1008, the copper layer 12', barrier layer 12''', and metal layer 12'' are patterned to form the bond pad 12 having a copper layer 12', barrier layers 12''', and layer of metal 12'' thereon for good wire bonding properties. A layer of insulation 13 is typically applied to the active surface 14 of the substrate 11 to protect the circuitry formed thereon of the semiconductor device 10. After the completion of the semiconductor device 10 having bond pads 12 including a copper layer 12', barrier layer 12''', and layer of metal 12" thereon, the semiconductor device may be assembled to a conductor lead of a TAB tape (not shown) for wire bonding a conductor lead to the bond pad 12 of the semiconductor device 10 using any suitable bonding process 1010 and apparatus.

It will be understood that changes, additions, deletions, and modifications may be made to be present invention which are intended to be within the scope of the claimed invention. Such are the use of a more than a single layer of metal over the copper layer to form a bond pad, the copper layer being a multi-layer of differing materials, the barrier layer being multiple layers of differing materials, the metal layer being multi-layers of differing materials, etc.

What is claimed is:

1. A method of forming a semiconductor device assembly, said method comprising:

providing a substrate having an upper surface and a lower surface;

depositing a layer of copper on at least a portion of the upper surface and the lower surface of the substrate in contact therewith;

depositing at least one layer of metal on at least a portion of the layer of copper; and patterning the layer of copper and the at least one layer of metal on one surface of the upper surface and the lower surface of the substrate to form at least one bond pad thereon.

2. The method of claim 1, further comprising: connecting one end of a wire to the at least one layer of metal using a wire bond.

3. The method of claim 1, wherein the at least one layer of metal comprises silver metal.

4. The method of claim 1, wherein the at least one layer of metal comprises gold metal.

5. The method of claim 1, wherein the at least one layer of metal comprises a silver alloy metal.

6. The method of claim 1, wherein the at least one layer of metal comprises a gold alloy metal.

7. The method of claim 1, wherein the at least one layer of metal comprises a silver and gold alloy metal.

8. The method of claim 1, wherein the at least one layer of metal comprises palladium metal.

9. The method of claim 1, wherein the at least one layer of metal comprises a noble metal alloy.

10. The method of claim 1, wherein the at least one layer of metal comprises nickel metal.

11. The method of claim 1, wherein the at least one layer of metal comprises nickel metal alloy.

12. The method of claim 1, further comprising:

depositing at least one other layer of metal on a portion of the at least one layer of metal.

13. The method of claim 12, wherein the at least one layer of metal comprises a silver metal alloy and wherein the at least one other layer of metal comprises a nickel metal alloy.

14. The method of claim 12, wherein the at least one layer of metal comprises a nickel metal alloy and wherein the at least one other layer of metal comprises a silver metal alloy.

15. The method of claim 12, wherein the at least one layer of metal comprises silver metal and wherein the at least one other layer of metal comprises nickel metal.

16. The method of claim 12, wherein the at least one layer of metal comprises nickel metal and wherein the at least one other layer of metal comprises a silver metal.

17. The method of claim 12, wherein the at least one layer of metal comprises a barrier layer of metal and the at least one other layer of metal comprises an adhesion promoting layer of metal for wire bonding thereto.

18. The method of claim 1, wherein the layer of copper comprises a zincated copper layer.

19. The method of claim 1, further comprising: depositing an insulative coating on a portion of the one surface of the upper surface and the lower surface of the substrate.

20. A method of forming a semiconductor device assembly, said method comprising:

providing a substrate having an upper surface and a lower surface;

depositing a layer of copper on at least a portion of the upper surface and the lower surface of the substrate in contact therewith;

patterning the layer of copper on one surface of the upper surface and the lower surface of the substrate to form at least one bond pad thereon; and depositing at least one layer of metal on at least a portion of the layer of copper.

21. The method of claim 20, further comprising:

connecting one end of a wire to the at least one layer of metal using a wire bond.

22. The method of claim 20, wherein the at least one layer of metal comprises silver metal.

23. The method of claim 20, wherein the at least one layer of metal comprises gold metal.

24. The method of claim 20, wherein the at least one layer of metal comprises a silver alloy metal.

25. The method of claim 20, wherein the at least one layer of metal comprises a gold alloy metal.

26. The method of claim 20, wherein the at least one layer of metal comprises a silver and gold alloy metal.

27. The method of claim 20, wherein the at least one layer of metal comprises palladium metal.

28. The method of claim 20, wherein the at least one layer of metal comprises a noble metal.

29. The method of claim 20, wherein the at least one layer of metal comprises a noble metal alloy.

30. The method of claim 20, wherein the at least one layer of metal comprises nickel metal.

31. The method of claim 20, wherein the at least one layer of metal comprises nickel metal alloy.

32. The method of claim 20, further comprising:

depositing at least one other layer of metal on a portion of the at least one layer of metal.

33. The method of claim 32, wherein the at least one layer of metal comprises a silver metal alloy and wherein the at least one other layer of metal comprises a nickel metal alloy.

34. The method of claim 32, wherein the at least one layer of metal comprises a nickel metal alloy and wherein the at least one other layer of metal comprises a silver metal alloy.

35. The method of claim 32, wherein the at least one layer of metal comprises silver metal and wherein the at least one other layer of metal comprises nickel metal.

36. The method of claim 32, wherein the at least one layer of metal comprises nickel metal and wherein the at least one other layer of metal comprises a silver metal.

37. The method of claim 32, wherein the at least one layer of metal comprises a barrier layer of metal and the at least one other layer of metal comprises an adhesion promoting layer of metal for wire bonding thereto.

38. The method of claim 20, wherein the layer of copper comprises a zincated copper layer.

39. The method of claim 20, further comprising:

depositing an insulative coating on a portion of the one surface of the upper surface and the lower surface of the substrate.

40. A method of forming a semiconductor device assembly, said method comprising:

providing a substrate having an upper surface and a lower surface;

depositing a layer of copper on at least a portion of the upper surface and the lower surface of the substrate in contact therewith;

depositing a barrier layer on at least a portion of the layer of copper;

depositing at least one layer of metal on at least a portion of the barrier layer; and patterning the layer of copper, the barrier layer and the at least one layer of metal on one surface of the upper surface and the lower surface of the substrate to form at least one bond pad thereon.

41. The method of claim 40, further comprising:

connecting one end of a wire to the at least one layer of metal using a wire bond.

42. The method of claim 40, further comprising:

connecting one end of conduct lead of a TAB tape to the at least one layer of gold metal using a wire bond.

43. A method of forming a semiconductor device assembly, said method comprising:

providing a substrate having an upper surface and a lower surface;

depositing a layer of copper on at least a portion of the upper surface and the lower surface of the substrate in contact therewith;

patterning the layer of copper on one surface of the upper surface and the lower surface of the substrate to form at least one bond pad thereon;

depositing at least one layer of metal on at least a portion of the layer of copper; and connecting one end of a conductor to the at least one layer of metal.

44. A method of forming a semiconductor device assembly, said method comprising:

providing a substrate having an upper surface and a lower surface;

depositing a layer of copper on at least a portion of the upper surface and the lower surface of the substrate in contact therewith;

depositing a barrier layer on at least a portion of the layer of copper;

depositing at least one layer of gold metal on at least a portion of the barrier layer; and patterning the layer of copper, the barrier layer and the at least one layer of gold metal on one surface of the upper surface and the lower surface of the substrate to form at least one bond pad thereon.

45. A method of forming a semiconductor device assembly, said method comprising:

providing a substrate having an upper surface and a lower surface;

depositing a layer of copper on at least a portion of the upper surface and the lower surface of the substrate in contact therewith;

patterning the layer of copper on one surface of the upper surface and the lower surface of the substrate to form at least one bond pad thereon;

depositing at least one layer of gold metal on at least a portion of the layer of copper; and connecting one end of a gold metal conductor to the at least one layer of gold metal.

46. A method of forming a semiconductor device assembly, said method comprising:

providing a substrate having an upper surface and a lower surface;

depositing a layer of copper on at least a portion of the upper surface and the lower surface of the substrate in contact therewith;

patterning the layer of copper on one surface of the upper surface and the lower surface of the substrate to form at least one bond pad thereon;

depositing at least one layer of metal on at least a portion of the layer of copper; and connecting one end of a conductor to the layer of copper of the at least one bond pad.

* * * * *

UNITED STATES PATENT AND TRADEMARK OFFICE
CERTIFICATE OF CORRECTION

PATENT NO.   : 6,544,880 B1
DATED         : April 8, 2003
INVENTOR(S)  : Salman Akram It is certified that error appears in the above-identified patent and that said Letters Patent is hereby corrected as shown below:

Title page,
Item [56], References Cited, U.S. PATENT DOCUMENTS, before "8/1992" delete "*"
Item [57], ABSTRACT,
Line 1, change "pond" to -- bond --

Drawings,
FIGURE 4D, change "20" to -- 21 -- as shown below:

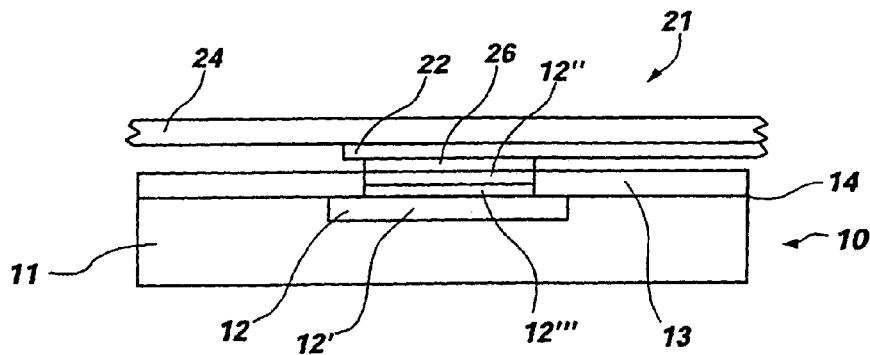

Fig. 4D

Column 1,
Line 30, delete the comma after "circuitry"
Line 37, after "die," and before "both," insert -- or --
Lines 47-48, change "ever increasing" to -- ever-increasing --
Line 49, insert a hyphen between "ever" and "increasing"
Line 56, change "die" to -- dice --
Line 60, after "of" and before "semiconductor" insert -- the --

Column 2,
Line 2, change "leadframe" (both occurrences) to -- lead frame --
Lines 5, 8, 9, 14, 46, 50 and 56, change "leadframe" to -- lead frame --
Line 23, insert a comma after "die"
Lines 24 and 25, insert a hyphen between "ever" and "increasing"
Lines 30□31, change "lead-frame" to -- lead frame -- and insert a comma after "frame"
Line 40, insert a comma after "device"
Line 47, change "finger" to -- fingers --
Line 63, change "leadframe" to -- lead frame -- and insert a comma after "frame"

UNITED STATES PATENT AND TRADEMARK OFFICE
CERTIFICATE OF CORRECTION

PATENT NO.    : 6,544,880 B1
DATED         : April 8, 2003
INVENTOR(S)   : Salman Akram It is certified that error appears in the above-identified patent and that said Letters Patent is hereby corrected as shown below:

Column 3,
Lines 1 and 15, change "leadframe" to -- lead frame --
Lines 3-4, change "ever increasing" to -- ever-increasing --
Line 5, insert a hyphen between "ever" and "increasing"
Line 10, change "leadframe" to -- lead frame -- and insert a comma after "frame"
Line 14, insert a hyphen between "increased" and "strength"
Line 18, after "die," and before "size" insert -- the --
Line 27, after "of" and before "semiconductor" insert -- a --
Line 33, change "Patents" to -- patents --
Line 35, insert a comma after "copper"
Line 49, starting a new paragraph on its own line, after "BRIEF DESCRIPTION OF THE DRAWINGS" insert -- In the drawings, which illustrate what is currently considered to be the best mode for carrying out the invention: --
Line 52, after "layers" and before "metal" insert -- of --
Line 66, change "bond" (second occurrence) to -- bonding --

Column 4,
Line 9, change "thereof" to -- of a semiconductor device 10 --
Line 16, change "bonds" to -- bond --
Line 27, after "as" and before "used" insert -- is --
Lines 35-36, change "and or" to -- and/or --
Line 39, insert a comma after "manner"
Line 54, after "14" and before "is" insert -- of substrate 11 --
Line 58, after "the" and before "layer" insert -- copper --
Line 60, change "12'. The" to -- 12', the --

Column 5,
Lines 3 and 34, change "to" to -- of substrate 11 of --  and after "the" and before "surface" insert -- active --
Line 8, change "processes. The" to -- processes, the --
Line 11, after "apparatus." start a new paragraph
Line 17, at the end of the line, insert a comma after "process"
Lines 41 and 54, change "being" to -- is --

Column 6,
Line 2, change "be" (second occurrence) to -- by --
Line 4, change "electrodeposited" to -- electrodeposition --
Line 16, insert a comma after "layer"
Line 31, change "to" to -- of substrate 11 of --
Line 32, after "the" and before "surface" insert -- active --
Line 37, change "being" to -- is --

UNITED STATES PATENT AND TRADEMARK OFFICE
CERTIFICATE OF CORRECTION

PATENT NO. : 6,544,880 B1
DATED : April 8, 2003
INVENTOR(S) : Salman Akram

It is certified that error appears in the above-identified patent and that said Letters Patent is hereby corrected as shown below:

<u>Column 6 (cont'd),</u>
Line 56, change "20" to -- 21 --

<u>Column 7,</u>
Line 5, change "the portion" to -- substrate 11 -- and change "having" to -- has --
Line 12, change "20" to -- 21 --
Line 12, change "metal layer" (first occurrence) to -- substrate --
Line 32, delete "for deposition"
Line 33, change "12'" (second occurrence) to -- 12" --

<u>Column 8,</u>
Lines 12 and 37, delete "for deposition"

<u>Column 9,</u>
Line 27, delete "for deposition"
Line 28, change "is" to -- are --
Line 51, change "1 1" to -- 11 --

<u>Column 10,</u>
Lines 9 and 35, delete "for deposition"

<u>Column 11,</u>
Line 10, change "be" (second occurrence) to -- the --
Line 12, delete "a" (first occurrence)
Line 14, change "multi-layer" to -- multiple layers --

Signed and Sealed this

Thirtieth Day of March, 2004

JON W. DUDAS
*Acting Director of the United States Patent and Trademark Office*